Figure 1:
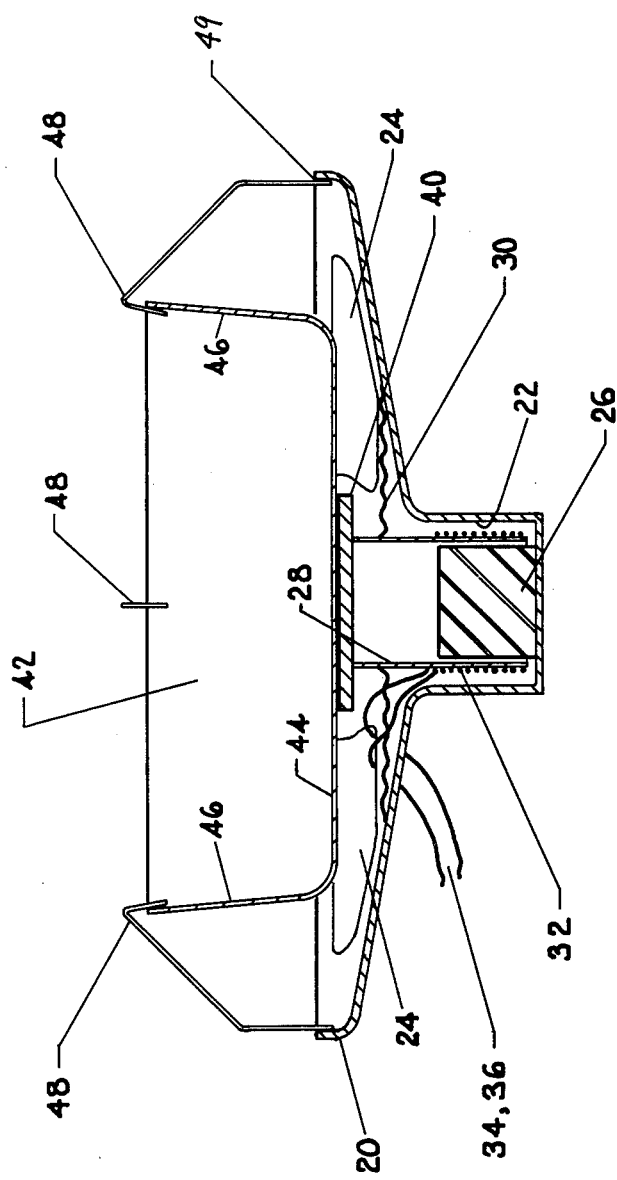

United States Patent [19]

Cielaszyk et al.

[11] 4,029,045
[45] June 14, 1977

[54] APPARATUS FOR APPLYING COATINGS

[75] Inventors: Dennis E. Cielaszyk; Andrew J. Meyer, both of Ann Arbor, Mich.

[73] Assignee: KMS Fusion, Inc., Ann Arbor, Mich.

[22] Filed: Mar. 29, 1976

[21] Appl. No.: 671,294

Related U.S. Application Data

[63] Continuation-in-part of Ser. No. 463,858, April 5, 1974, abandoned.

[52] U.S. Cl. .................................. 118/49; 427/251
[51] Int. Cl.² ........................................ C23C 13/12
[58] Field of Search ............... 118/48, 49, 49.1, 50, 118/303, DIG. 2, DIG. 5; 427/217, 255, 251, 57; 259/72, 75, 180

[56] References Cited

UNITED STATES PATENTS

| | | | |
|---|---|---|---|
| 2,374,331 | 4/1945 | Cooke | 427/217 |
| 3,050,981 | 8/1962 | Schwarz | 118/49 X |
| 3,082,124 | 3/1963 | French et al. | 118/49 X |
| 3,189,535 | 6/1965 | Webb | 427/251 |
| 3,378,393 | 4/1968 | Roberts | 427/217 |
| 3,537,886 | 11/1970 | Rively et al. | 118/49 X |

Primary Examiner—Mervin Stein
Attorney, Agent, or Firm—Barnes, Kisselle, Raisch & Choate

[57] ABSTRACT

An apparatus for applying coatings to very small objects which includes levitating the objects in an environment established for vapor deposition or sputtering in such a way that a uniform coating can be applied. The design includes a permanent magnet and a retaining diaphragm together with a variable frequency oscillator and amplifier to achieve vibrations of the diaphragm during the coating operation in such magnitude as to keep the selected particles suspended above the diaphragm to expose the entire surface to the coating being applied.

2 Claims, 2 Drawing Figures

LEVITATOR SYSTEM

APPARATUS FOR APPLYING COATINGS

This application is a continuation-part of our copending application entitled "Process and Apparatus to Improve Uniform Coatings," Ser. No. 463,858, filed on Apr. 5, 1974, now abandoned.

This invention relates to an Apparatus for Applying Coatings to spheres and more particularly to a system which permits a uniform coating to be applied to tiny glass microscopic products by vapor deposition or sputtering, for example.

There is much experimental work being done presently to expose a fusion fuel as, for example, deuterium or deuterium-tritium to a pulsed laser beam. U.S. Pats. which disclose this process in a general way are:

| | | | |
|---|---|---|---|
| 3,378,446 | April | 16, 1968 | Whittlesey |
| 3,489,645 | Jan. | 13, 1970 | Daiber |
| 3,624,239 | Nov. | 30, 1971 | Fraas |
| 3,762,992 | Oct. | 2, 1973 | Hedstrom |

In addition, there are a number of pending applications of Keith A. Brueckner which disclose such a process. One such application, with a common assignee to the present case, bears Ser. No. 377,508 and a filing date of July 10, 1973.

The above patents disclose the use of a droplet of deuterium or a pellet under cryogenic temperatures so that it can be treated as a solid. These patents contemplate dropping fuel into a reaction chamber and timing the laser pulse to meet the droplet at about the center of the reaction chamber. Another patent application of Robert J. Teitel and David E. Solomon, Ser. No. 339,558, filed Mar. 9, 1973, with a common assignee to the present case, discloses a fuel configuration in the form of a tiny hollow, glass sphere which is filled with fusion fuel, such as deuterium or deuterium-tritium, by utilizing the inherent permeability characteristics of the glass walls of the sphere and causing the fuel in gaseous form to move through the walls to the interior of the sphere. Once the fuel is charged, the spheres can be stored for long periods under suitable conditions until used in the fusion process.

In some instances, it is desirable to coat the glass spheres having diameters in a range of 10 to 500 microns for the purpose of improving the fusion characteristics or simply to retain the stored hydrogen. The coating processes may include vapor deposition or sputtering or any coating process which can be carried on in a closed container such that levitating a particle in the coating atmosphere will cause even deposition of a coating.

The objective is to provide a condition in which a coating can be obtained completely and uniformly around the particle. A mechanical vibrator employing a motor driven ratchet can be utilized but there are practical considerations with operations conducted in a vacuum or other controlled atmosphere container. The present invention makes it possible to obtain pure vertical vibrational forces as distinguised from the vertical and horizontal action imparted by the mechanical vibrator. The vertical action obtained keeps the particles levitated for a long time and insures a uniform coating.

It is therefore an object of the present invention to provide an apparatus for achieving a uniform coating by creating a vibrating container which will cause the particles to be levitated during deposition.

It is a further object to provide a system which can be readily controlled remotely while it is housed in a controlled atmosphere container.

Other objects and features of the invention will be apparent in the following description and claims in which the utility of the invention together with the principles of operation are set forth in connection with the best mode presently contemplated for the practice of the invention.

Drawings accompany the disclosure and the various views thereof can be briefly described as:

FIG. 1, a levitator construction shown in cross-section.

Figure 2:
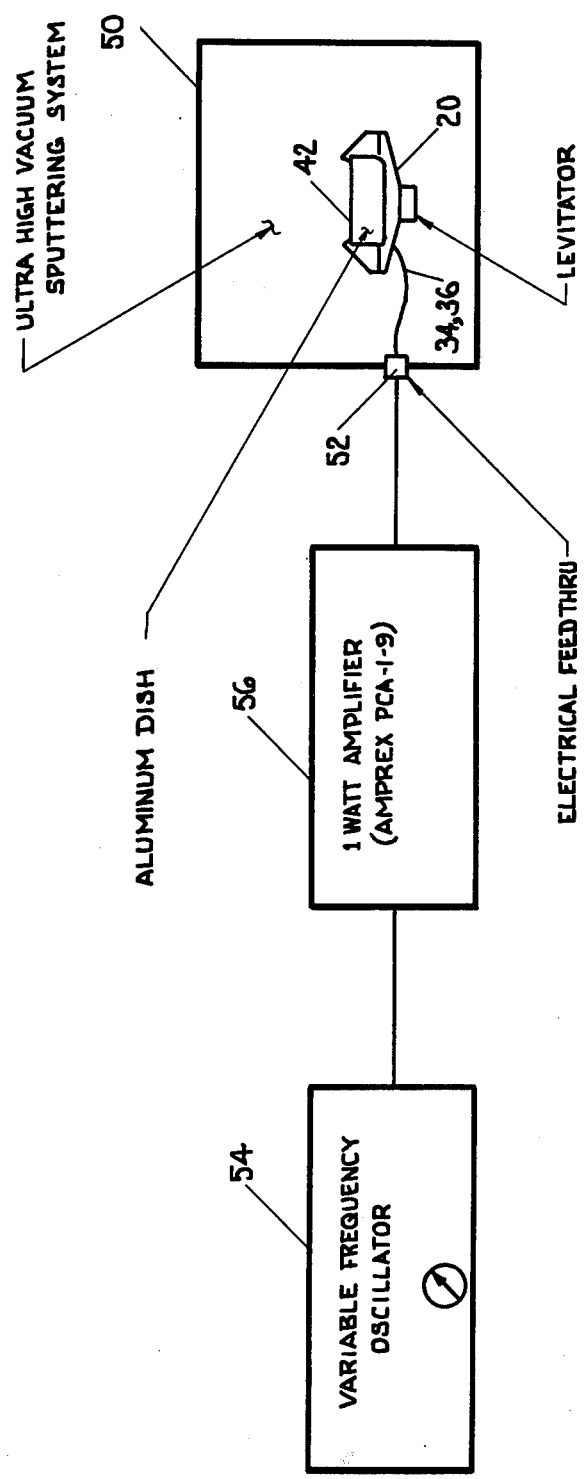

FIG. 2, a schematic view of a circuit utilized to control the system.

With reference to the drawings, in FIG. 1, the levitator unit is shown formed of a cone element 20 having a central dish-shaped recess 22. This is a structure similar in nature to the support used for a 2 foot loudspeaker having relatively large holes 24 around the area of the cone. A permanent magnet 26 is disposed in the bottom of the dish recess 22. Spaced from the magnet is a cylindrical element 28 formed of a non-ferrous material such as aluminum or a phenolic plastic in the form of a cylinder about ½ inch in diameter and having a wall thickness of about 0.020 inch. This cylinder 28 is concentric with the magnet and the dished recess 22, but supported freely by a circularly corrugated diaphragm 30. A coil 32 of conductive wire called a drive coil is mounted in the dished recess on the cylindrical element 28 having lead wires 34, 36 which extend out from the device. These are normal components of a loudspeaker.

The element 28 is capped by a Dupont Teflon disc 40, or similar plastic, which supports an aluminum weighing dish 42 formed of thin aluminum metal about 0.010 inch thick with a diameter about 2 inches. This is a dish which is similar to or identical with a dish used in laboratory scales so that it weighs about 1/30th to 1/15th of an ounce. The dish could also be formed of magnesium or a light plastic and has a base 44 and a sidewall 46. It will be seen from the drawings that the dish 42 is formed with a very thin wall and being of aluminum, it will be very light. Resilient wire clips 48, four in number, welded at one end to the cone 20 as at 49, extend upwardly and over the edges of the dish to retain it in position on the plate of disc 40.

In FIG. 2, there is shown a diagrammatic layout of the system. The levitator unit is shown housed in a vacuum chamber 50 which contains a suitable sputtering system or a vapor deposition system. The leads 34, 36 connect to an electrical feedthrough connector box 52 which is vacuum tight. A power circuit, which includes a variable frequency oscillator 54 having a range of 100 to 5000 Hz feeds to an amplifier unit 56 having a range of 0 to 5 watts. These elements, namely, the oscillator 54 and the amplifier 56 are mounted outside the chamber 50 as shown in FIG. 2. These are standard readily available electrical units which will permit close control of the vibrating plate 40 and the dish 42.

In the operation of the device, the dish 42 is charged with a suitable quantity of small objects such as tiny glass spheres which will overlie the bottom of the dish. The dish is inserted under the resilient clips 48 and maintained in as near level position as possible. The electrical system is turned to the "on" position and the frequency and amplitude are adjusted to impart suitable vibrations which induce vertical motion of the particles upwardly away from the bottom of the dish. The coating system can in the meantime be readied so that the chamber 50 is exhausted of air and the coating cycle initiated via (a) sputtering atmosphere, or (b) a vapor deposition atmosphere in the chamber. The source material will deposit on the levitated particles and provide a uniform coating, the thickness of which is dependent on the time of exposure and other known parameters as described in the following table. When the cycle is complete, the system is shut down and the dish 42 is removed.

TABLE

| Typical Deposition | |
|---|---|
| Coating | Ni, Cu, Al |
| Range of diameter | 90–150 microns |
| Quantity of microspheres | ~ $10^4$ |
| Partial Pressure | 10 microns |
| Time of Deposition | 6–12 minutes |
| Rate of Evaporation | 166 Å/minute |
| Rate of Deposition (on microsphere) | 41.5 Å/minute |
| % lost during processing | 10 |
| % uniform | 50 |

We claim:

1. An apparatus for coating small particles to be introduced into a coating chamber which comprises:
   a. a dish support in said chamber of light material with a weight of 1/15 to 1/30th of an ounce having a support bottom and retaining side walls,
   b. means in said chamber to confine said support wherein it may have an unrestrained vertical motion in a direction normal to said support bottom,
   c. means in said chamber to vibrate said support in a direction normal to said bottom at a rapid rate comprising a magnetic drive coil of an audio speaker, and
   d. control means outside said chamber connected electrically to said drive coil including a frequency oscillator and an amplifier to control the magnitude of the oscillations to cause particles on the support to pulse vertically into the space above said support bottom.

2. An apparatus for coating small particles to be introduced into a coating chamber which comprises:
   a. a support for particles having at leas a portion lying in a plane,
   b. means to confine said support wherein it may have an unrestrained vertical motion in a direction normal to said plane, and
   c. means to vibrate said support only in a vertical direction normal to said plane at a rapid rate to cause particles on the support to pulse vertically into the space above said support,
   d. said means to vibrate said support comprising a drive coil concentrically surrounding a magnet, resilient means to support said drive coil, a frequently oscillator to feed an oscillating current to said coil to cause it to vibrate in the direction of the axis of the coil, and an amplifier to control the magnitude of the oscillations.

* * * * *